(12) United States Patent
Wu et al.

(10) Patent No.: US 12,249,649 B2
(45) Date of Patent: Mar. 11, 2025

(54) SEMICONDUCTOR DEVICE

(71) Applicant: UNITED MICROELECTRONICS CORP., Hsin-Chu (TW)

(72) Inventors: Cheng-Han Wu, Hsinchu (TW); Hsin-Yu Chen, Nantou County (TW); Chun-Hao Lin, Kaohsiung (TW); Shou-Wei Hsieh, Hsinchu (TW); Chih-Ming Su, Tainan (TW); Yi-Ren Chen, Kaohsiung (TW); Yuan-Ting Chuang, Yilan County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 141 days.

(21) Appl. No.: 17/207,751

(22) Filed: Mar. 22, 2021

(65) Prior Publication Data

US 2021/0210628 A1 Jul. 8, 2021

Related U.S. Application Data

(63) Continuation of application No. 16/252,715, filed on Jan. 21, 2019, now Pat. No. 10,991,824.

(30) Foreign Application Priority Data

Dec. 21, 2018 (TW) .................................. 107146345

(51) Int. Cl.
*H01L 29/78* (2006.01)
*H01L 21/762* (2006.01)
*H01L 29/417* (2006.01)

(52) U.S. Cl.
CPC ...... *H01L 29/785* (2013.01); *H01L 21/76224* (2013.01); *H01L 29/41791* (2013.01); *H01L 29/7831* (2013.01)

(58) Field of Classification Search
CPC ......... H01L 27/10855; H01L 29/66795; H01L 27/10823; H01L 27/10876; H01L 29/4236; H01L 21/76897; H01L 27/10885
See application file for complete search history.

(56) References Cited

U.S. PATENT DOCUMENTS

| | | | |
|---|---|---|---|
| 9,368,496 B1 | 6/2016 | Yu | |
| 2006/0043498 A1 | 3/2006 | Orlowski | |
| 2010/0012190 A1* | 1/2010 | Goto | .................. H01L 31/1804 |
| | | | 438/96 |
| 2010/0081244 A1 | 4/2010 | Papageorgiou | |
| 2010/0320509 A1* | 12/2010 | Knorr | ............... H01L 21/76832 |
| | | | 257/E21.409 |

(Continued)

*Primary Examiner* — Brian Turner
(74) *Attorney, Agent, or Firm* — Winston Hsu

(57) ABSTRACT

A semiconductor device includes a fin-shaped structure on the substrate, a shallow trench isolation (STI) around the fin-shaped structure, a single diffusion break (SDB) structure in the fin-shaped structure for dividing the fin-shaped structure into a first portion and a second portion; a first gate structure on the fin-shaped structure, a second gate structure on the STI, and a third gate structure on the SDB structure. Preferably, a width of the third gate structure is greater than a width of the second gate structure and each of the first gate structure, the second gate structure, and the third gate structure includes a U-shaped high-k dielectric layer, a U-shaped work function metal layer, and a low-resistance metal layer.

18 Claims, 3 Drawing Sheets

(56) References Cited

U.S. PATENT DOCUMENTS

| | | |
|---|---|---|
| 2011/0108918 A1 | 5/2011 | Yin |
| 2011/0210375 A1 | 9/2011 | Ikeda |
| 2014/0027783 A1* | 1/2014 | Yin ................... H01L 29/7853 |
| | | 257/77 |
| 2014/0091371 A1 | 4/2014 | Son |
| 2014/0353763 A1* | 12/2014 | Chung ............ H01L 21/823431 |
| | | 257/390 |
| 2015/0064870 A1 | 3/2015 | Shin |
| 2015/0104913 A1 | 4/2015 | Liu |
| 2015/0115373 A1 | 4/2015 | Yu |
| 2015/0214051 A1* | 7/2015 | Kim ................. H01L 21/02609 |
| | | 438/494 |
| 2015/0357436 A1* | 12/2015 | Shen ................. H01L 29/7848 |
| | | 257/190 |
| 2016/0163851 A9* | 6/2016 | Yu .................... H01L 21/67248 |
| | | 438/283 |
| 2016/0372381 A1 | 12/2016 | Tung |
| 2017/0098708 A1 | 4/2017 | Shen |
| 2017/0117410 A1 | 4/2017 | Hu |
| 2017/0194436 A1 | 7/2017 | Basker |
| 2017/0263722 A1 | 9/2017 | You |
| 2017/0278925 A1 | 9/2017 | Peng |
| 2017/0294508 A1 | 10/2017 | Hsu |
| 2017/0365522 A1* | 12/2017 | Jeong ............. H01L 21/823878 |
| 2018/0061943 A1* | 3/2018 | Choi ................. H01L 29/66545 |
| 2018/0211959 A1* | 7/2018 | Yu .................... H01L 29/66636 |
| 2018/0277662 A1 | 9/2018 | Liang |
| 2019/0237563 A1* | 8/2019 | Sim .................. H01L 21/28185 |
| 2020/0066895 A1* | 2/2020 | Cheng ................ H01L 27/0886 |
| 2020/0083363 A1* | 3/2020 | Zang ................ H01L 29/41791 |

\* cited by examiner

SEMICONDUCTOR DEVICE

CROSS REFERENCE TO RELATED APPLICATIONS

This is a continuation application of U.S. patent application Ser. No. 16/252,715, filed on Jan. 21, 2019, and all benefits of such earlier application are hereby claimed for this new continuation application.

BACKGROUND OF THE INVENTION

1. Field of the Invention

The invention relates to a semiconductor device, and more particularly to a semiconductor device of integrating single diffusion break (SDB) structure and metal oxide semiconductor (MOS) device.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems. Hence how to improve the current FinFET fabrication and structure has become an important task in this field.

SUMMARY OF THE INVENTION

According to an embodiment of the present invention, a semiconductor device includes a first gate structure on a substrate, a first epitaxial layer on one side of the first gate structure, and a second epitaxial layer on another side of the first gate structure. Preferably, the first epitaxial layer and the second epitaxial layer include different sizes and the first gate structure includes a U-shaped high-k dielectric layer, a U-shaped work function metal layer, and a low-resistance metal layer.

According to another aspect of the present invention, a semiconductor device includes a fin-shaped structure on the substrate, a shallow trench isolation (STI) around the fin-shaped structure, a single diffusion break (SDB) structure in the fin-shaped structure for dividing the fin-shaped structure into a first portion and a second portion; a first gate structure on the fin-shaped structure, a second gate structure on the STI, and a third gate structure on the SDB structure. Preferably, a width of the third gate structure is greater than a width of the second gate structure and each of the first gate structure, the second gate structure, and the third gate structure includes a U-shaped high-k dielectric layer, a U-shaped work function metal layer, and a low-resistance metal layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
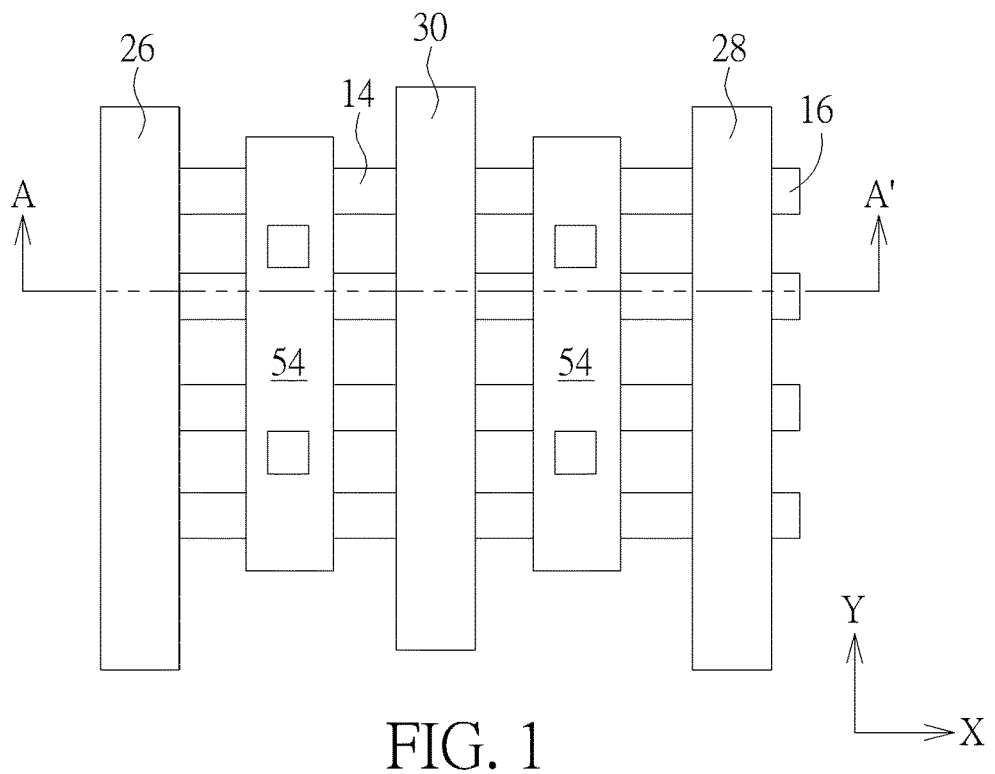
FIG. 1 illustrates a top view of a semiconductor device according to an embodiment of the present invention.
Figure 2:
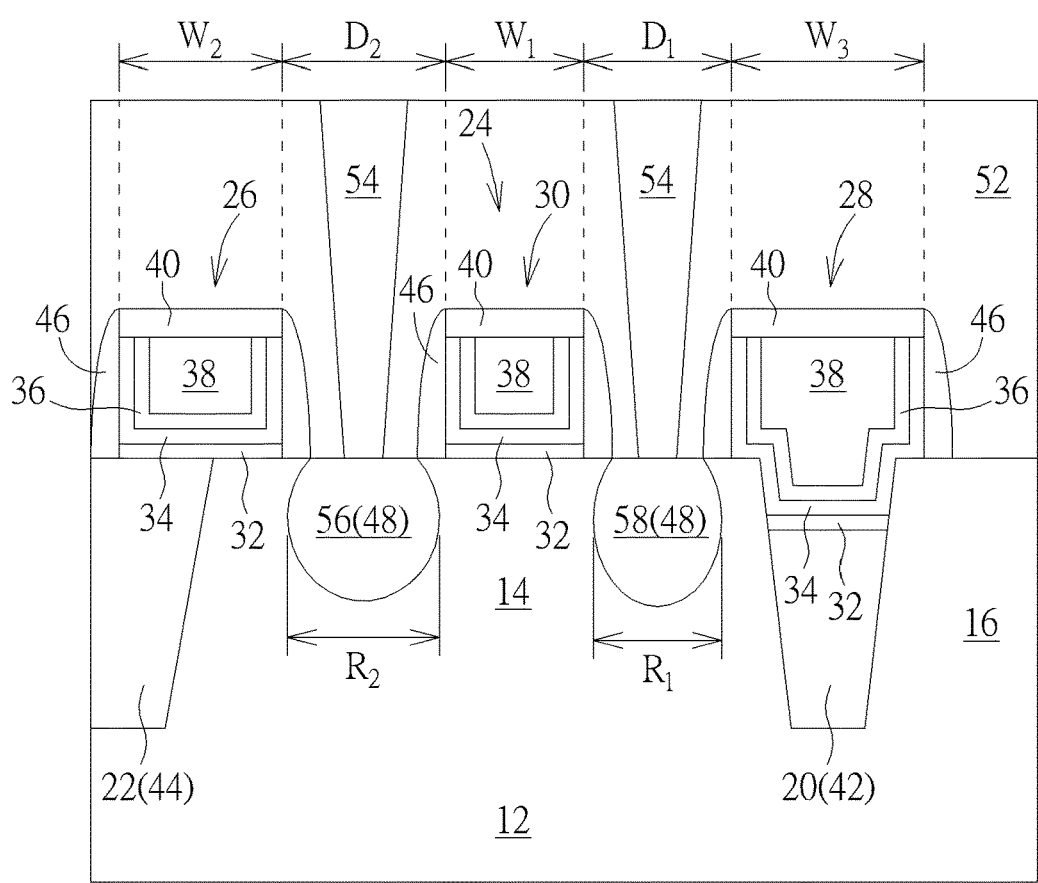
FIG. 2 illustrates a cross-sectional view of FIG. 1 along the sectional line AA'.

Referring to FIG. 1-2, FIG. 1 illustrate a top-view of a semiconductor device according to an embodiment of the present invention and FIG. 2 illustrates a cross-sectional view of FIG. 1 along the sectional line AA'. As shown in FIGS. 1-2, a substrate 12, such as a silicon substrate or silicon-on-insulator (SOI) substrate is provided, and at least a fin-shaped structure, such as fin-shaped structures 14, 16 are formed on the substrate 12, in which the bottom portion of the fin-shaped structures 14, 16 are surrounded by an insulation material to form isolation structures 20, 22.

According to an embodiment of the present invention, the fin-shaped structures 14, 16 are preferably fabricated by a sidewall pattern transfer (SIT) technique, the procedures of which generally include first inputting a layout pattern into a computer system and modifying the layout pattern through suitable calculations. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. Next, sacrificial layers can be removed completely by performing an etching process. Through the etching process, the pattern defined by the spacers can be transferred into the substrate underneath, and through additional fin cut processes, desirable pattern structures such as stripe patterned fin-shaped structures could be obtained.

Alternatively, the fin-shaped structures 14, 16 could also obtained by first forming a patterned mask (not shown) on the substrate 12, and through an etching process, the pattern of the patterned mask is transferred to the substrate 12 to form the fin-shaped structures. Moreover, the formation of the fin-shaped structures 14 could also be accomplished by first forming a patterned hard mask (not shown) on the substrate 12 and a semiconductor layer composed of silicon germanium is grown from the substrate 12 through exposed patterned hard mask via selective epitaxial growth process to form the corresponding fin-shaped structures 14. These approaches for forming the fin-shaped structures 14 are all within the scope of the present invention.

Next, at least a MOS transistor 24 is formed on the fin structures 14, 16 and gate structures 26, 28 are formed on two sides of the MOS transistor 24, in which the gate structure 30 of the MOS transistor 24 is preferably an active gate structure while the gate structure 26, 28 disposed on two sides of the MOS transistor 24 are dummy gates. In this embodiment, the gate structures 26, 28 and 30 could be fabricated by a gate first process, a high-k first approach from gate last process, or a high-k last approach from gate last process, in which each of the gate structures 26, 28 and 30 could be a polysilicon gate or a metal gate depending on the demand of the process.

For instance, the gate structures are fabricated by a high-k last approach and a replacement metal gate (RMG) process in this embodiment, in which each of the gate structures 26, 28 and 30 is preferably composed of an interfacial layer or a gate dielectric layer 32, a U-shaped high-k dielectric layer 34, a U-shaped work function metal layer 36, and a low-resistance metal layer 38. Preferably, a hard mask 40 made of silicon nitride is disposed atop each of the gate structures 26, 28, 30. Since the process of using high-k last approach and RMG process to transform dummy gate into metal gate is well known to those skilled in the art, the details of which are not explained herein for the sake of brevity.

In this embodiment, the high-k dielectric layer 34 is preferably selected from dielectric materials having dielectric constant (k value) larger than 4. For instance, the high-k dielectric layer 48 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 36 is formed for tuning the work function of the later formed metal gates to be appropriate in an NMOS or a PMOS. For an NMOS transistor, the work function metal layer 36 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 36 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 36 and the low resistance metal layer 38, in which the material of the barrier layer may include titanium (Ti), titanium nitride (TiN), tantalum (Ta) or tantalum nitride (TaN). Furthermore, the material of the low-resistance metal layer 38 may include copper (Cu), aluminum (Al), titanium aluminum (TiAl), tungsten (W), cobalt tungsten phosphide (CoWP) or any combination thereof.

It should be noted that as shown in the top view of FIG. 1, the fin-shaped structures 14, 16 are preferably disposed extending along a first direction (such as X-direction), the gate structures 26, 28 and 30 are preferably disposed extending along a second direction (such as Y-direction) that is orthogonal to the first direction, the isolation structure 20 directly under the gate structure 28 is also disposed extending along the second direction as the gate structure 28, and the isolation structure 22 on the end portion of the fin-shaped structure 14, 16 are disposed to surround the entire fin-shaped structures 14,16

In this embodiment, the isolation structure 20 and the isolation structure 22 are preferably formed from different isolation fabrication processes. The formation of the isolation structure 20 could be accomplished by first forming a fin-shaped structure on the substrate 12, conducting an etching process to divide the fin-shaped structure into two portions (such as the fin-shaped structures 14 and 16), and then filling a dielectric material between the divided fin-shaped structures 14, 16 to form a single diffusion break (SDB) structure 42. The isolation structure 22 is essentially a shallow trench isolation (STI) 44 surrounding the fin-shaped structures 14, 16 after the fin-shaped structures 14, 16 are being divided.

It should be noted that the isolation structures 20, 22 adjacent to two sides of the MOS transistor 24 could be fabricated from same material and/or different processes. For instance, the isolation structures 20, 22 adjacent to two sides of MOS transistor 24 could include a combination of different materials and different depths or a combination of same material and different depths depending on the demand of the product to improve the flow of electric current when the device is turned on. As illustrated by the MOS transistor shown in FIG. 2, the isolation structure 20 on the right side of the gate structure 30 and the isolation structure 22 on the left side of the gate structure 30 are preferably composed of different dielectric material, in which the isolation structure 20 is preferably composed of a dielectric material or even a material carrying tensile stress such as silicon nitride and the isolation structure 22 is preferably composed of silicon oxide.

Viewing from a more detailed perspective, a top surface of the SDB structure 42 composed of silicon nitride having tensile stress is preferably lower than the top surface of the fin-shaped structures 14, 16, and a top surface of the STI 44 composed of silicon oxide is preferably even with a top surface of the fin-shaped structures 14, 16. It is to be noted that even though a bottom surface of the SDB structure 42 is even with a bottom surface of the STI 44 in this embodiment, according to another embodiment of the present invention not only a top surface of the SDB structure 42 can be lower than a top surface of the STI 44 but also a bottom surface of the SDB structure 42 is lower than a bottom surface of the STI 44. These variations are all within the scope of the present invention.

Moreover, the gate structure 28 disposed directly on top of the SDB structure 42 preferably spans over to stand on the two adjacent fin-shaped structures 14, 16 at the same time while overlapping the SDB structure 42 entirely. The gate structure 26 on the left side on the other hand overlaps or stands on the STI 44 and the fin-shaped structure 14 at the same time, in which the bottom surface of the gate structure 28 on the SDB structure 42 is preferably extended into part of the fin-shaped structures 14, 16 and lower than a top surface of the fin-shaped structures 14, 16 while the bottom surface of the gate structure 26 on the left side is even with the top surface of the fin-shaped structures 14, 16.

As shown in FIG. 2, at least one spacer 46 is disposed on the sidewalls of each of the gate structures 26, 28, 30 or gate electrodes and a source/drain region 48 is formed in the substructure 12 adjacent to two sides of the gate structure 30. Preferably, silicides (not shown) could be formed on the surface of the source/drain region 48, an interlayer dielectric (ILD) layer 52 is formed on the gate structures 26, 28, 30, and multiple contact plugs 54 are formed in the ILD layer 52 to electrically connect the source/drain regions 48.

In this embodiment, the spacer 46 can be a single spacer or a composite spacer, such as a spacer including but not limited to for example an offset spacer and a main spacer. Preferably, the offset spacer and the main spacer could include same material or different material while both the offset spacer and the main spacer can be made of material including but not limited to for example $SiO_2$, SiN, SiON, SiCN, or combination thereof. The interlayer dielectric (ILD) layer 52 preferably includes silicon oxide and the contact plugs 54 can include a barrier layer including titanium (Ti), titanium nitride (TiN), tantalum (Ta) or tantalum nitride (TaN) and a metal layer including tungsten (W), copper (Cu), aluminum (Al), titanium aluminum (TiAl), cobalt tungsten phosphide (CoWP) or any combination thereof.

Viewing from a more detailed perspective, the source/drain region 48 on the left side of the gate structure 30 includes an epitaxial layer 56 and the source/drain region 48 on the right side of the gate structure 30 includes another epitaxial layer 58, in which the epitaxial layers 56, 58 could include n-type or p-type dopants while the epitaxial layers 56, 58 could also include different epitaxial materials. For instance, if the transistor being fabricated were to be a PMOS transistor, the epitaxial layers 56, 58 preferably include silicon germanium (SiGe), but not limited thereto. If the transistor being fabricated were to be a NMOS transistor the epitaxial layers 56, 58 preferably include silicon phosphorus (SiP), but not limited thereto.

It should be noted that the epitaxial layer 56 and the epitaxial layer 58 preferably include different sizes, in which the definition of "different sizes" could be interpreted by having different shapes, different diameters, or any other features or parameters that could be used to clearly distinguish between the epitaxial layers 56, 58 visually. Preferably, the epitaxial layer 56 on the left side of the gate structure 30 or between the gate structures 26, 30 include a circle or circular profile while the epitaxial layer 58 on the right side of the gate structure 30 or between the gate structures 28, 30 includes an ellipse or elliptical profile, in which the diameter $R_1$ of the ellipse, or more specifically, the short axis through the center of the ellipse is preferably less than the diameter $R_2$ of the circle.

Since the diameter $R_1$ or the short axis of the elliptical epitaxial layer 58 on the right side of the gate structure 30 is preferably less than the diameter $R_2$ of the epitaxial layer 56 on the left side of the gate structure 30, the distance between the gate structure 28 and the gate structure 30, or more specifically, the distance $D_1$ measuring from the left sidewall of the gate electrode of the gate structure 28 to the right sidewall of the gate electrode of the gate structure 30 is preferably less than the distance between the gate structure 26 and the gate structure 30 or more specifically the distance $D_2$ measuring from the left sidewall of the gate electrode of the gate structure 30 to the right sidewall of the gate electrode of the gate structure 26.

In addition, the three gate structure 26, 28, 30 in this embodiment could also include different combinations of the same widths and/or different widths depending on the demand of the product. For instance, as shown in FIG. 2, the width $W_1$ of the middle gate structure 30 or gate electrode is preferably less than the width $W_2$ of the gate structure 26 on the left side while the width $W_2$ of the gate structure 26 is further less than the width $W_3$ of the gate structure 28 on the right side. Nevertheless, according to an embodiment of the present invention, the width $W_1$ of the middle gate structure 30 could be equal to the width $W_2$ of the gate structure 26 on the left while the width $W_2$ of the gate structure 26 is less than the width $W_3$ of the gate structure 28 on the right. In other words, the gate structure 26 and the gate structure 30 could be having same widths $W_1$ and $W_2$ while each of the widths $W_1$ and $W_2$ is less than the width $W_3$ of the gate structure 28 directly on the SDB structure 42. These variations are all within the scope of the present invention.

Figure 3:
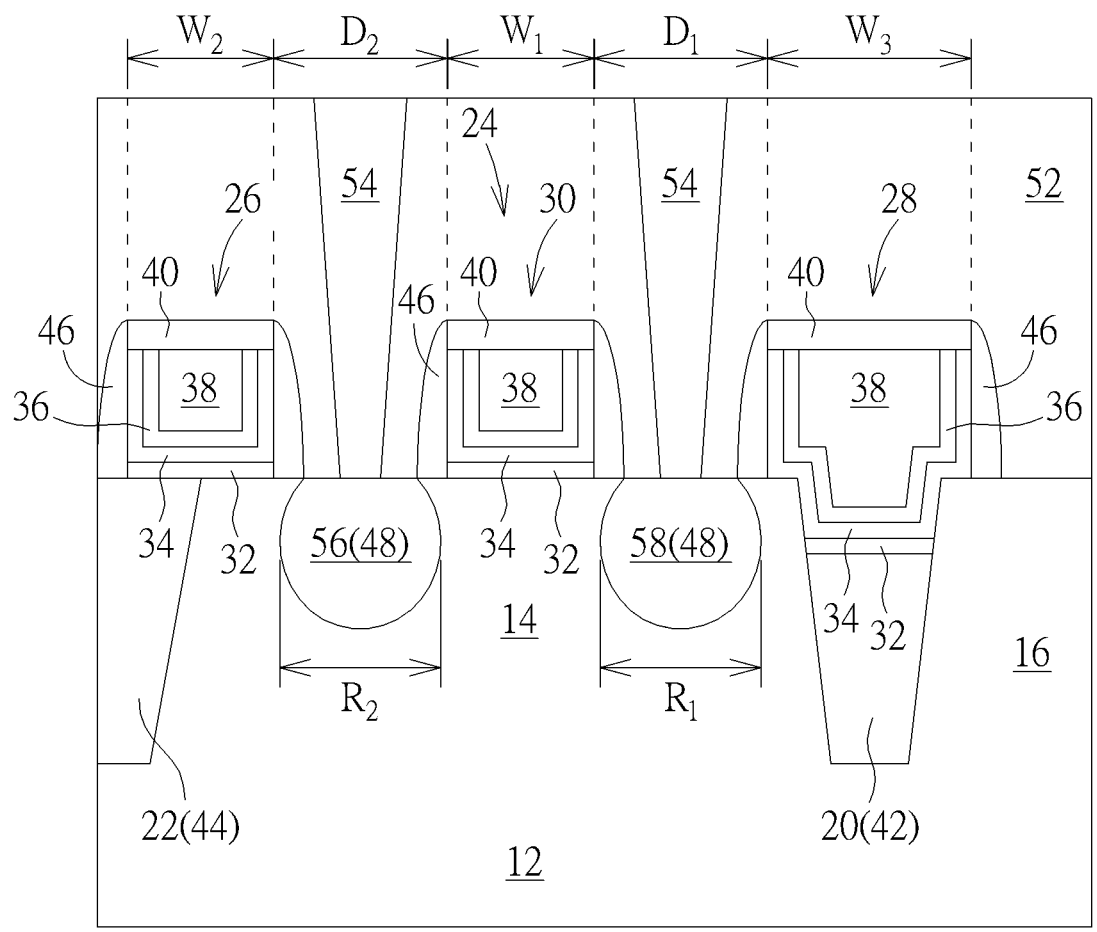
FIG. 3 illustrates a structural view of a semiconductor device according an embodiment of the present invention.

Referring to FIG. 3, FIG. 3 illustrates a structural view of a semiconductor device according to an embodiment of the present invention. As shown in FIG. 3, in contrast to epitaxial layers 56, 58 having different sizes therebetween or the gate structures 26, 28, 30 having different gaps therebetween as disclosed in the embodiment shown in FIG. 2, according to an embodiment of the present invention, it would be desirable to adjust the position of each of the gate structures 26, 28, 30 so that each of the gate structures 26, 28, 30 could have different widths while having same spacing therebetween, and at the same time the epitaxial layers 56, 58 disposed adjacent to two sides of the gate structure 30 also include same size and/or the same diameter thereby improving the leakage performance of the transistor device.

Specifically, each of the epitaxial layers 56, 58 adjacent to two sides of the gate structure 30 could include a circular or substantially circular profile, in which the diameter $R_2$ of the epitaxial layers 56 on the left side of the gate structure 30 or between the gate structures 26, 30 is preferably equal to the diameter $R_1$ of the epitaxial layer 58 on the right side of the gate structure 30 or between the gate structures 28, 30.

Since the diameter $R_2$ of the epitaxial layer 56 on the left side of the gate structure 30 is preferably equal to the diameter $R_1$ of the epitaxial layer 58 on the right side of the gate structure 30, the distance $D_1$ between the gate structures 28, 30 or more specifically the distance $D_1$ measuring from the left sidewall of the gate structure 28 to the right sidewall of the gate structure 30 is preferably equal to the distance $D_2$ between the gate structures 26, 30 or more specifically the distance $D_2$ measuring from the left sidewall of the gate structure 30 to the right sidewall of the gate structure 26.

Similar to the aforementioned embodiment, the three gate structure 26, 28, 30 in this embodiment could also include different combinations of the same widths and/or different widths depending on the demand of the product. For instance, as shown in FIG. 3, the width $W_1$ of the middle gate structure 30 or gate electrode is preferably less than the width $W_2$ of the gate structure 26 on the left side while the width $W_2$ of the gate structure 26 is further less than the width $W_3$ of the gate structure 28 on the right side. Nevertheless, according to an embodiment of the present invention, the width $W_1$ of the middle gate structure 30 could be equal to the width $W_2$ of the gate structure 26 on the left while the width $W_2$ of the gate structure 26 is less than the width $W_3$ of the gate structure 28 on the right. In other words, the gate structure 26 and the gate structure 30 could be having same widths $W_1$ and $W_2$ while each of the widths $W_1$ and $W_2$ is less than the width $W_3$ of the gate structure 28 directly on the SDB structure 42. These variations are all within the scope of the present invention.

Figure 4:
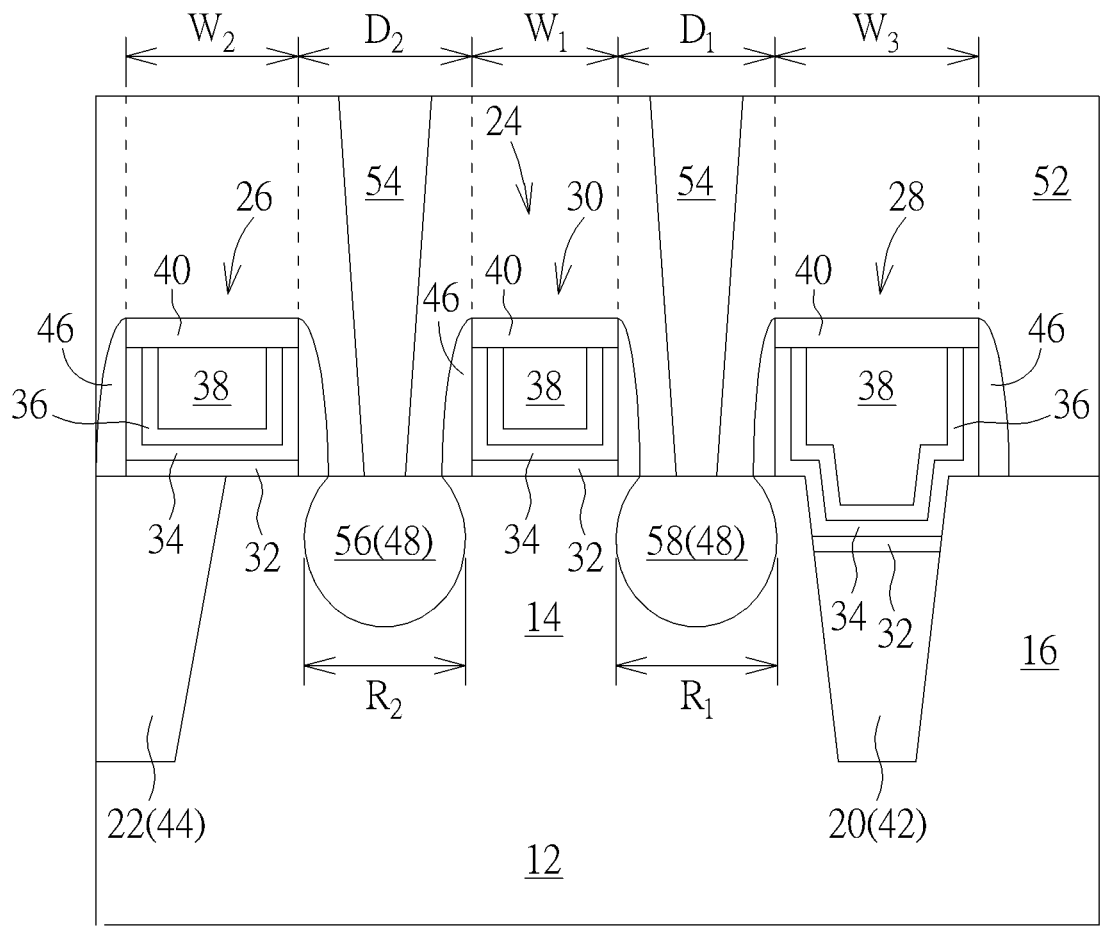
FIG. 4 illustrates a structural view of a semiconductor device according an embodiment of the present invention.

Referring to FIG. 4, FIG. 4 illustrates a structural view of a semiconductor device according to an embodiment of the present invention. As shown in FIG. 4, in contrast to the epitaxial layers 56, 58 having different sizes as shown in FIG. 2, the present invention may additionally perform an extra photo-etching process to remove or thin a portion of the spacer 46 on the right sidewall of the gate structure 30 and a portion of the spacer 46 on the left sidewall of the gate structure 28 during formation of the spacers 46. By doing so, the epitaxial layer 56 disposed on the left side of the gate structure 30 and the epitaxial layer 58 on the right side of the gate structure 30 could thereby having same size, shape, and diameter after forming recess in the fin-shaped structure 14 and filling the epitaxial layer 58 in the recess. In other words, asymmetrical spacers 46 are formed on left and right sidewalls of the gate structure 28, 30, in which the thickness of the spacer 46 on left sidewall of the gate structure 28 is preferably less than the spacer 46 on right sidewall of the gate structure 28 and the thickness of the spacer 46 on right sidewall of the gate structure 30 is less than the spacer 46 on left sidewall of the gate structure 30. In addition, even though the diameter $R_1$ of the substantially circular epitaxial layer 58 on right side of the gate structure 30 is preferably equal to the diameter $R_2$ of the substantially circular epitaxial layer 56 on the left side, the distance $D_1$ between the gate structure 28 and the gate structure 30 is still less than the distance $D_2$ between the gate structures 26, 30 as disclosed in the embodiment of FIG. 2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first gate structure on a substrate, wherein the first gate structure comprises:
      a U-shaped high-k dielectric layer;
      a U-shaped work function metal layer; and
      a low-resistance metal layer;
      two spacers disposed on two sides of the U-shaped high-k dielectric layer respectively;
   a first epitaxial layer on one side of the first gate structure; and
   a second epitaxial layer on another side of the first gate structure, wherein the first epitaxial layer and the second epitaxial layer comprise different sizes and top surfaces of the first epitaxial layer and the second epitaxial layer are coplanar, and wherein a portion of the first epitaxial layer and a portion of the second epitaxial layer are disposed right under the spacers, wherein viewed from a cross section, the cross section of the first epitaxial layer is a major segment of a circular shape, and a width of the first epitaxial layer is larger than a depth of the first epitaxial layer, and the cross section of the second epitaxial layer is a major segment of an ellipse shape, wherein the second epitaxial layer has a flat top surface, and a lower portion of the second epitaxial layer has an elliptical profile, and wherein a short axis through the center of the ellipse shape of the second epitaxial layer is less than a diameter of the circular shape of the first epitaxial layer.

2. The semiconductor device of claim 1, wherein a diameter of the second epitaxial layer is less than a diameter of the first epitaxial layer.

3. The semiconductor device of claim 1, further comprising:
   a fin-shaped structure on the substrate;
   a shallow trench isolation (STI) around the fin-shaped structure; and
   a single diffusion break (SDB) structure in the fin-shaped structure for dividing the fin-shaped structure into a first portion and a second portion.

4. The semiconductor device of claim 3, wherein the fin-shaped structure is disposed extending along a first direction and the SDB structure is disposed extending along a second direction.

5. The semiconductor device of claim 4, wherein the first direction is orthogonal to the second direction.

6. The semiconductor device of claim 3, further comprising:
   a second gate structure adjacent to the first epitaxial layer and on the STI; and
   a third gate structure adjacent to the second epitaxial layer and on the SDB structure.

7. The semiconductor device of claim 6, wherein a width of the first gate structure is less than a width of the second gate structure and the width of the second gate structure is less than a width of the third gate structure.

8. The semiconductor device of claim 6, wherein a width of the first gate structure is equal to a width of the second gate structure and the width of the second gate structure is less than a width of the third gate structure.

9. The semiconductor device of claim 6, wherein a width between the first gate structure and the third gate structure is less than a width between the first gate structure and the second gate structure.

10. A semiconductor device, comprising:
    a fin-shaped structure on the substrate;
    a shallow trench isolation (STI) around the fin-shaped structure;
    a single diffusion break (SDB) structure in the fin-shaped structure for dividing the fin-shaped structure into a first portion and a second portion;
    a first gate structure on the fin-shaped structure;
    a second gate structure on the STI;
    a third gate structure on the SDB structure, wherein the first gate structure is disposed between the second gate structure and the third gate structure, a width of the third gate structure is greater than a width of the second gate structure, wherein there is no other gate structures disposed between the first gate structure and the second gate structure, and there is no other gate structures disposed between the first gate structure and the third gate structure, and each of the first gate structure, the second gate structure, and the third gate structure comprises:
       a U-shaped high-k dielectric layer;
       a U-shaped work function metal layer; and
       a low-resistance metal layer; and
    a first epitaxial layer between the first gate structure and the second gate structure; and
    a second epitaxial layer between the second gate structure and the third gate structure, wherein viewed from a cross section, the cross section of the first epitaxial layer is a major segment of a circular shape, and a width of the first epitaxial layer is larger than a depth of the first epitaxial layer, and the cross section of the second epitaxial layer is a major segment of an ellipse shape, wherein the second epitaxial layer has a flat top surface, and a lower portion of the second epitaxial layer has an elliptical profile, and wherein a short axis through the center of the ellipse shape of the second epitaxial layer is less than a diameter of the circular shape of the first epitaxial layer.

11. The semiconductor device of claim 10, wherein a width of the second gate structure is greater than a width of the first gate structure.

12. The semiconductor device of claim 10, wherein a width of the second gate structure is equal to a width of the first gate structure.

13. The semiconductor device of claim 10, wherein a top surface of the STI is even with a top surface of the fin-shaped structure and a top surface of the SDB structure is lower than the top surface of the fin-shaped structure.

14. The semiconductor device of claim 10, wherein a bottom surface of the third gate structure is lower than a top surface of the fin-shaped structure.

15. The semiconductor device of claim 10, wherein the second gate structure overlaps the STI and the fin-shaped structure.

16. The semiconductor device of claim 10, wherein a diameter of the first epitaxial layer is equal to a diameter of the second epitaxial layer.

17. The semiconductor device of claim 10, wherein the fin-shaped structure is disposed extending along a first direction and the SDB structure is disposed extending along a second direction.

18. The semiconductor device of claim 17, wherein the first direction is orthogonal to the second direction.

* * * * *